(12) United States Patent
Morita

(10) Patent No.: US 6,265,723 B1
(45) Date of Patent: Jul. 24, 2001

(54) MAGNETIC SHIELD APPARATUS

(75) Inventor: Takashi Morita, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/218,501

(22) Filed: Dec. 22, 1998

(30) Foreign Application Priority Data

Dec. 22, 1997 (JP) ................................... 9-353051

(51) Int. Cl.⁷ .............................. G21F 3/00; H05K 9/00
(52) U.S. Cl. ................................. 250/515.1; 250/517.1; 250/492.2; 361/816
(58) Field of Search ......................... 250/515.1, 517.1, 250/492.21, 492.2; 361/816, 818

(56) References Cited

U.S. PATENT DOCUMENTS 4,482,811 * 11/1984 Burgess ........................... 250/515.1

FOREIGN PATENT DOCUMENTS

| 59-197198 | 11/1984 | (JP) . |
| 64-57700 | 3/1989 | (JP) . |
| 3-12497 | 2/1991 | (JP) . |
| 7-122886 | 5/1995 | (JP) . |

* cited by examiner

Primary Examiner—Bruce C. Anderson

(57) ABSTRACT

A magnetic shield apparatus includes a magnetic shield room, a tubular member, and a flange portion. The magnetic shield room has an opening to shield external magnetism. The tubular member is made of a magnetic shield material and attached to the opening to project from the magnetic shield room by a first predetermined length. The flange portion is made of a magnetic shield material and formed around a distal end portion of the tubular member to be spaced apart from it by a second predetermined length.

12 Claims, 5 Drawing Sheets

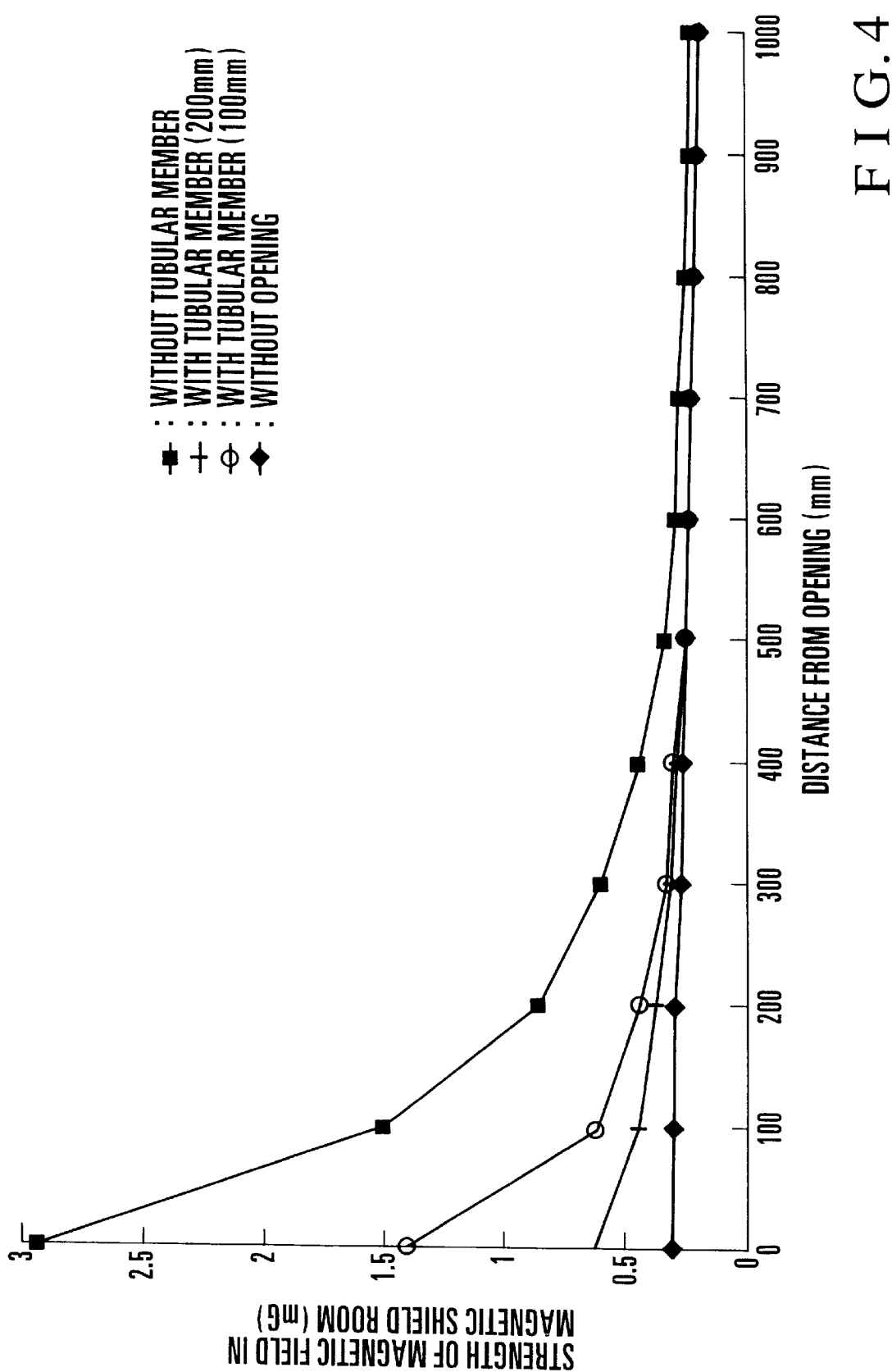
F I G. 4

MAGNETIC SHIELD APPARATUS

BACKGROUND OF THE INVENTION

The present invention relates to a magnetic shield room and, more particularly, to a magnetic shield room having an opening portion through which wafers and the like are unloaded and loaded.

Conventionally, as a unit for forming a resist pattern on a sample such as a wafer or mask, an EB (Electron Beam) exposure unit which draws a pattern on a photoresist by using an electron beam is used.

An EB exposure unit of this type has a problem that the electron beam irradiation position varies by the influence of the external magnetic field to undesirably cause a distortion in the drawn pattern. In order to prevent this, such an EB exposure unit is arranged in a shield room to operate while it is shielded from the external magnetic field.

Concerning a wafer or mask to be processed by the EB exposure unit, a cassette which stores a plurality of wafers or masks is usually handled as one unit. Therefore, the EB exposure unit has a loading portion for extracting a wafer or mask as a processing target from the cassette and supplying it to the processing chamber, and an unloading portion for storing a processed wafer or mask in the cassette. Also, a means for attaching and detaching the cassette to and from the loading and unloading portions is necessary.

When such loading and unloading portions are arranged in the magnetic shield room, conventionally, the cassette is manually loaded and unloaded by the operator or the like through an inlet/outlet port formed in the magnetic shield room and provided with a normally closed door.

When the door is opened to allow the operator to enter or leave the room, the EB exposure unit is influenced by the external magnetic field. Therefore, when loading/unloading the cassette, operation of the EB exposure unit must be temporarily stopped, leading to a decrease in throughput.

FIG. 6 shows a conventional magnetic shield room. As shown in FIG. 6, a maintenance door 3 is provided to the side wall of a magnetic shield room 1, and a magnetic field shield material is adhered to the inner wall of the magnetic shield room 1. An EB exposure unit (not shown) or the like is arranged in the magnetic shield room 1.

With this arrangement, to prevent the influence of the external magnetic field, an opening portion having such a size that it does not allow the external magnetic field to influence the EB exposure unit may be formed in the magnetic shield room 1, and the cassette may be loaded/unloaded through this opening portion.

Based on the demands for a higher micropatterning degree and a higher integration degree in recent semiconductor integrated circuits, a strict pattern drawing precision of 0.1 µm or less has been required, and the magnetic field around the EB exposure unit must be suppressed as low as possible.

If an opening portion having a size required for loading/unloading a cassette (e.g., one having a size of 180 mm×180 mm×180 mm) is formed, the external magnetic shield enters the magnetic shield room 1 through the opening portion to adversely affect the EB exposure unit. Therefore, the EB exposure unit must be installed to be sufficiently remote from the opening. As a result, the area occupied by the magnetic shield room 1 with respect to the area occupied by the EB exposure unit becomes considerably large.

In order to set the strength of the entering external magnetic field not to influence the EB exposure unit, the length of the short sides of the rectangular opening portion must be decreased to 100 mm or less. With this size, however, at most only one wafer or mask can be passed through this opening portion, and wafers and masks stored in a cassette cannot be loaded/unloaded at all.

As a method of suppressing entrance of the external magnetic field into the magnetic shield room 1 through the opening, one in which a tubular magnetic field shield material is provided to the outside of the opening portion is proposed, as shown in Japanese Patent Laid-Open No. 59-197198.

In order to improve the magnetic shield effect without decreasing the opening ratio, a technique as shown in Japanese Utility Model Laid-Open No. 3-12497 is proposed, in which a stereoscopic shield lattice having a depth is further arranged in a tubular shield material arranged outside the opening portion, such that the interval pitch is smaller than the depth.

In order to sufficiently shield the external magnetic shield by providing a tube made of a magnetic shield material at the opening portion, the length of the tubular member must be increased in accordance with the size of the opening. If, however, the tubular member is long, it interferes with the operability of loading/unloading the cassette in/from the loading and unloading portions in the magnetic shield room. For example, when the operability of placing the cassette on the loading or unloading portion is considered, the length of the tubular member is preferably as small as possible.

When a shield lattice is arranged in the tubular member, it is suitable for an application such as a vent port. For an application, e.g., a case that includes loading/unloading of a cassette, the lattice interval must be increased. For this reason, the length of the tubular member must be increased in accordance with the size of the opening, thus interfering with the operability.

SUMMARY OF THE INVENTION

It is an object of the present invention to provide a magnetic shield room which suppresses entrance of an external magnetic field and allows loading/unloading of a cassette.

It is another object of the present invention to provide a magnetic shield room in which operability of loading/unloading the cassette is improved.

In order to achieve the above objects, according to the present invention, there is provided a magnetic shield apparatus comprising a magnetic shield room having an opening to shield external magnetism, a tubular member made of a magnetic shield material and attached to the opening to project from the magnetic shield room by a first predetermined length, and a flange portion made of a magnetic shield material and formed around a distal end portion of the tubular member to be spaced apart therefrom by a second predetermined length.

BRIEF DESCRIPTION OF THE DRAWINGS

FIG. 4 is a graph showing the relationship between the distance from the opening and the strength of magnetic field in the magnetic shield room;

DESCRIPTION OF THE PREFERRED EMBODIMENT

The present invention will be described in detail with reference to the accompanying drawings.

Figure 1A:
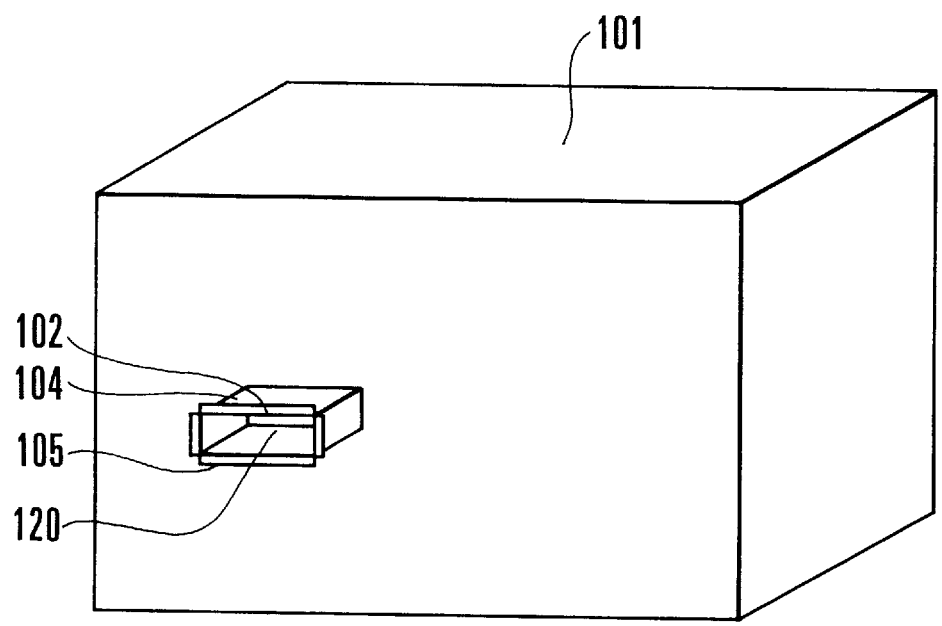
FIG. 1A is a perspective view of a magnetic shield room according to an embodiment of the present invention.
Figure 1B:
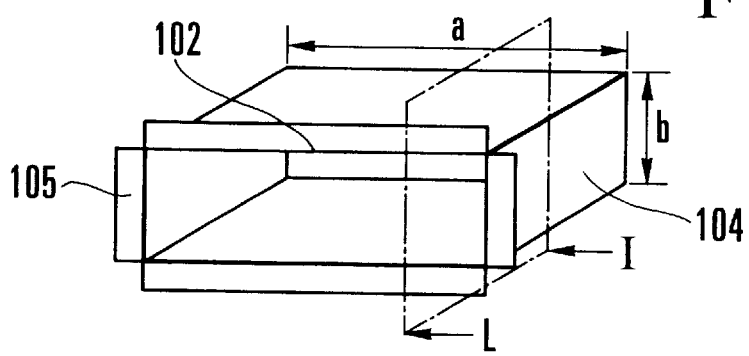
FIG. 1B is an enlarged perspective view of a tubular member shown in FIG. 1A.

Referring to FIG. 1A, a rectangular opening 120 is formed in the side surface of a magnetic shield room 101 having an inner wall adhered with a magnetic shield material. A tubular member 104 made of a magnetic shield material (e.g., permalloy) and having a rectangular section is attached to the opening 120 with rivets or the like. A portion of the tubular member 104 extending from its distal end for a predetermined length is outwardly bent at a right angle with respect to the tube axis to form a flange portion 105, as shown in FIG. 1B. More specifically, the flange portion 105 is constituted by the bent portions of the four sides of the distal end portion of the tubular member 104. An opening portion 102 is formed by the distal end portion of the tubular member 104 to communicate with the opening 120.

Figure 2A:
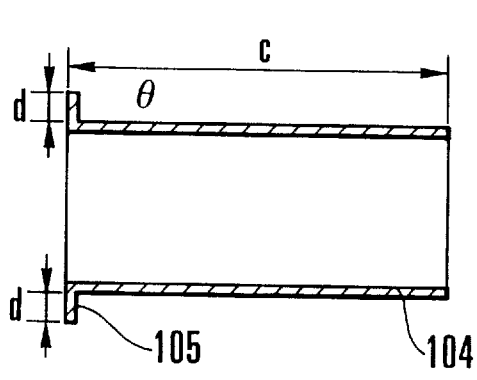
FIG. 2A is a sectional view taken along the line I—I of FIG. 1B.

As shown in FIG. 2A, the flange portion 105 is formed by bending the edges of the tubular member 104 outwardly and perpendicularly. When the size of the opening portion 102, i.e., the sectional size of the tubular member 104, the length of the tubular member 104, and the length of the flange portion 105, are defined as a×b, c, and d, respectively, in this embodiment, these sizes are set as follows:

size of the opening portion 102:
   a=990 mm
   b=250 mm
size of the tubular member 104:
   the sectional size is equal to that of the opening portion 102
   c=100 mm
size of the flange portion 105:
   d=10 mm to 20 mm
angle of the flange portion 105 with respect to the tube axis
   θ=90°

When the size a of the opening portion 102 is set to 990 mm mentioned above, three cassettes can be arranged horizontally. A description will be made on an assumption that the tubular member 104 has no thickness.

Note that the present invention is not limited to these values. It suffices if at least a portion of the tubular member 104 extending from its distal end for a predetermined length is inclined outwardly of the tubular member 104 at an angle of almost 90° with respect to the tube axis. Preferably, the size d of the flange portion 105 may be set to 10 mm or more and the angle θ of the flange portion 105 with respect to the tube axis may be set to 90°.

Figure 2B:
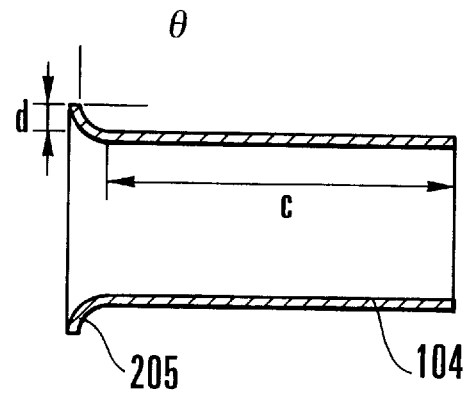
FIG. 2B is a sectional view showing another tubular member.

As shown in FIG. 2B, a portion of the tubular member 104 near its distal end may be bent outwardly to have a certain radius of curvature, thereby forming a flange portion 205 having an arcuated section. In FIG. 2B as well, it suffices if the distal end of the tubular member 104 is inclined outwardly of the tubular member 104 with respect to the tube axis. Preferably, a size d of the flange portion 205 may be set to 10 mm or more and an angle θ formed by the tangential direction at the edge of the flange portion 205 and the tube axis may be set to 90°.

Figures 3A, 3B:
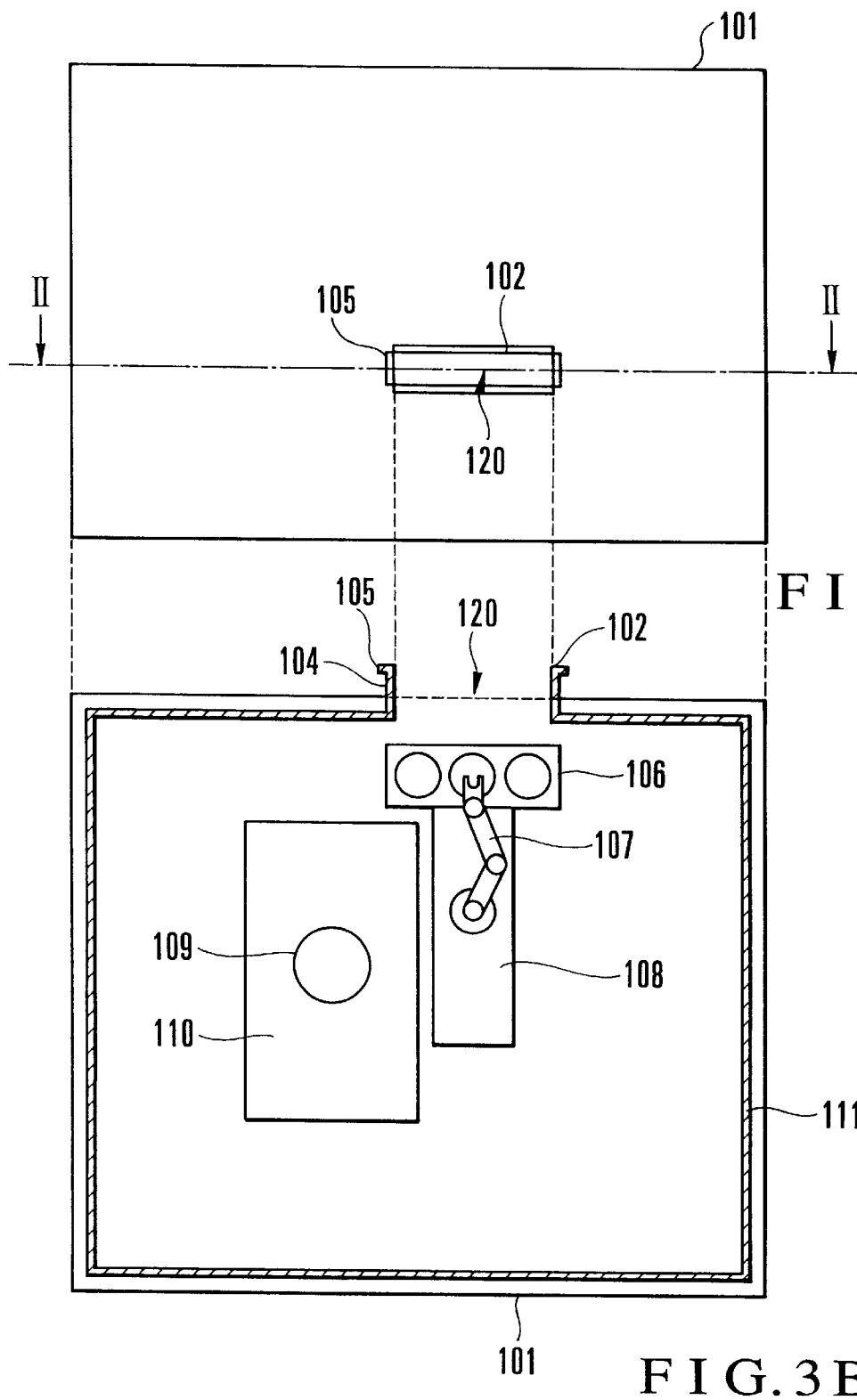
FIG. 3A is a front view of the magnetic shield room shown in FIG. 1.
FIG. 3B is a sectional view of the magnetic shield room taken along the line II—II of FIG. 3A.

As shown in FIG. 3A, the opening 120 is formed in one of the four side surfaces of the magnetic shield room 101. As shown in FIG. 3B, a magnetic shield material 111 is adhered to the entire inner wall of the magnetic shield room 101 without any gap to form a tubular member 104 projecting from the opening 120. A loading/unloading portion 106 for loading/unloading wafers or masks is arranged near the opening 120. A cassette loaded in the magnetic shield room 101 through the opening portion 102, the tubular member 104, and the opening 120 is mounted on the loading/unloading portion 106.

The wafers and the like stored in the cassette are conveyed into a column 109 in an EB exposure unit 110 with an arm 107 of a convey arm portion 108, and are exposed. Thereafter, the exposed wafers are mounted on the cassette again by the arm 107 in an order reverse to that described above. The cassette mounted with the wafers is unloaded outside the magnetic shield room 101 through the opening 120, the tubular member 104, and the opening portion 102.

If the tubular member 104 Is excessively long, it causes a trouble when mounting the cassette on the loading/unloading portion 106. The length of the tubular member 104 is preferably 200 mm or less.

The relationship between presence/absence of the tubular member 104 and the influence of the external magnetic field will be described.

FIG. 4 shows the relationship between the distance from the opening portion 102 and the strength of magnetic field in the magnetic shield room 101 when the external magnetic field has a strength of 5 mG. The size of the opening portion 102 is a×b=990 mm×250 mm.

As shown in FIG. 4, when the opening 120 is not formed, the magnetic field in the magnetic shield room 101 is 0.3 mG near the shield wall, 0.25 mG at a position separate from the shield wall by 500 mm, and 0.17 mG at a position separate from the shield wall by 1,000 mm, thus being attenuated gradually.

In contrast to this, when only the opening portion 102, i.e., the tubular member 104, is formed, the magnetic field near the opening 120 exhibits a value near about 3 mG but is 0.35 mG at a position separate from the opening 120 by 500 mm, thus being attenuated sharply. At a position farther separate from the opening 120, the magnetic field is attenuated gradually. However, even at a position separate from the opening 120 by 1,000 mm, the magnetic field has a strength of 0.23 mG, which is higher than the value obtained when the opening 120 is not formed by about 0.06 mG.

In the first example provided with the tubular member 104 of c=200 mm which has the flange portion 105 of d=10 mm and θ=90°, the strength is 0.6 mG immediately inside the opening 120, but at a position separate from the opening 120 by 500 mm, the magnetic field is attenuated sharply to a value almost equal to that obtained when the opening 120 is not formed, and at a position separate from the opening 120 by 1,000 mm, the magnetic field is attenuated gradually to 0.17 mG.

In contrast to this, when the tubular member 104 having no flange portion 105 is used, to obtain a shield effect almost equal to that described above, the tubular member 104 must have a length of 600 mm or more. This suggests effectiveness of the present invention in decreasing the length of the tubular member 104.

In the second example provided with the tubular member 104 of c=100 mm which has the flange portion 105 of d=10 mm and θ=90°, the strength is about 1.4 mG immediately inside the opening 120, but at a position separate from the opening 120 by 500 mm, the magnetic field is attenuated sharply to a value almost equal to that obtained when the opening 120 is not formed, and at a position separate from the opening 120 by 1,000 mm, the magnetic field is attenuated gradually to 0.17 mG.

Figure 5A:
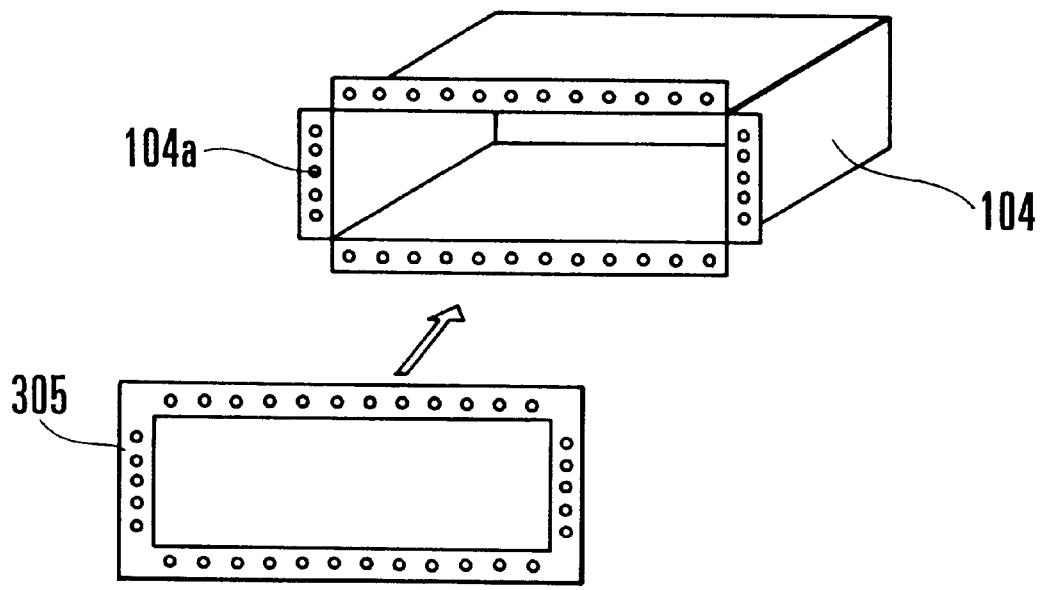
FIG. 5A is a perspective view of the tubular member and a flange portion before assembly.
Figure 5B:
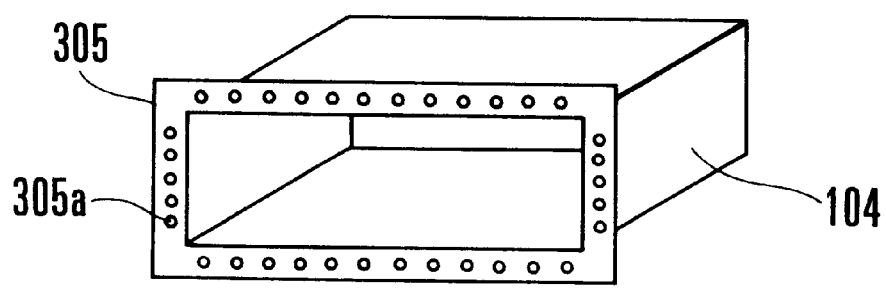
FIG. 5B is a perspective view of the tubular member and the flange portion after assembly.
Figure 6:
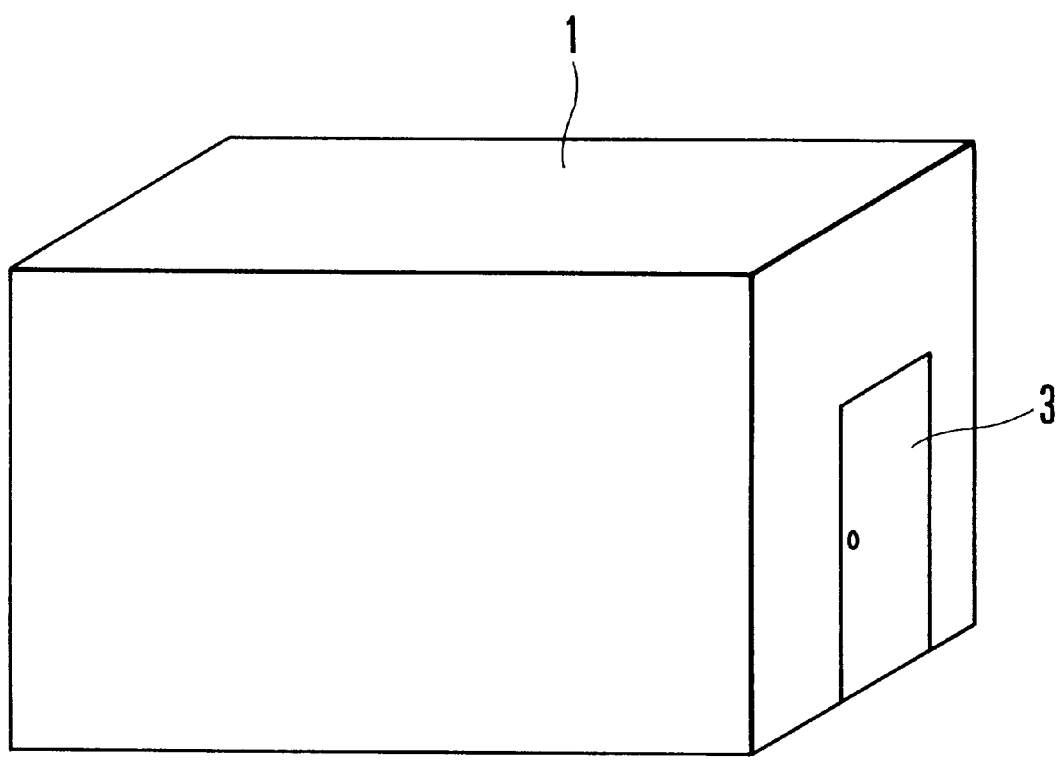
FIG. 6 is a perspective view of a conventional magnetic shield room.

The flange portion 105 may be formed by bending the edge of the distal end of the tubular member 104, as described above, or by mounting a rectangularly annular flange member 305 on flange-like edges 104a of the tubular member 104, shown in FIG. 5A, by using rivets 305a, as shown in FIG. 5B. In this case, if the number of rivets 305a is increased or the flange member 305 is connected and fixed to the distal end portion of the tubular member 104 in accordance with another mounting method, e.g., welding, in place of the rivets 305a, the adhesion strength of the connecting portion can be increased. This decreases the impedance of the connecting portion so that the internal magnetic field can be emitted outside more easily.

Connecting portions made of a magnetic shield material may be mounted to the notched portions between edges 104a of the tubular member 104 to connect the edges 104a to each other, thereby forming a flange portion continuously surrounding the opening portion 102 of the tubular member 104.

Alternatively, no edges 104a may be formed on the tubular member 104, but a rectangularly annular flange member 305 made of a magnetic shield material may be attached to the distal end of the tubular member 104 with a known method. Alternatively, a tubular portion may be formed on the flange member 305 and be fixed to the tubular member 104 by fitting. Alternatively, instead of the flange member 305, strip segments made of a magnetic material and constituting a flange portion may be separately attached to the respective sides of the distal end portion of the tubular member 104.

As has been described above, according to the present invention, a tubular member having a flange portion is formed on the opening of a magnetic shield room. Even if the size of the opening is increased, the influence of the external magnetic field on the interior of the magnetic shield room can be decreased. More specifically, when compared to a case using only a tubular member, the same effect to that obtained by using a long tubular member can be obtained with a short tubular member. For example, when a tubular member having a flange portion and a length of about 100 mm is formed on the opening, the same effect as that obtained when no opening is formed can be obtained at a position separate from the opening by 500 mm. This allows loading/unloading of the cassette through the opening, and accordingly the loading/unloading portion can be arranged in the magnetic shield room, thus increasing the throughput.

Since entrance of the external magnetic field through the opening can be suppressed more than in the conventional case, the distance between the EB exposure unit and the opening can be decreased. Since no extra space is required unlike in the conventional case, the magnetic shield room can be made compact.

What is claimed is:

1. A magnetic shield apparatus comprising:

a magnetic shield room having an opening to shield external magnetism;

a tubular member made of a magnetic shield material and attached to said opening to project from said magnetic shield room by a first predetermined length; and a flange portion made of a magnetic shield material and formed around a distal end portion of said tubular member to be spaced apart therefrom by a second predetermined length.

2. An apparatus according to claim 1, wherein the first predetermined length of said tubular member is not more than 200 mm.

3. An apparatus according to claim 1, wherein the second predetermined length of said flange portion is not less than 10 mm.

4. An apparatus according to claim 1, wherein said flange portion extends outwardly from said tubular member to form an angle of substantially 90° with respect to a tube axis.

5. An apparatus according to claim 1, wherein said flange portion extends outwardly from said tubular member to form an arc with respect to a tube axis.

6. An apparatus according to claim 1, wherein said flange portion is constituted by a bent portion formed by bending said distal end portion of said tubular member outwardly therefrom with respect to a tube axis.

7. An apparatus according to claim 6, wherein said tubular member has a rectangular section and said opening of said tubular member has a rectangular shape, and said flange portion is constituted by four bent portions formed along four sides of said distal end portion of said tubular member.

8. An apparatus according to claim 7, wherein said flange portion is formed into an annular shape by connecting adjacent ones of said bent portions with connecting members made of a magnetic shield material.

9. An apparatus according to claim 1, wherein said flange portion is constituted by an exclusive flange member made of a magnetic shield material and attached around said distal end portion of said tubular member.

10. An apparatus according to claim 9, wherein said tubular member has a rectangular section and said opening of said tubular member has a rectangular shape, and said flange portion has a rectangularly annular shape corresponding to four sides of said distal end portion of said tubular member.

11. An apparatus according to claim 1, wherein said magnetic shield room stores an electron beam (EB) exposure unit for drawing a pattern on a photoresist for a sample by using an electron beam, and a loading/unloading portion for transferring the sample with respect to said EB exposure unit.

12. An apparatus according to claim 1, wherein said magnetic shield room has an inner wall adhered with a magnetic shield material, and said tubular member made of said magnetic shield material is connected to said magnetic shield material of said magnetic shield room.

* * * * *